(12) United States Patent  (10) Patent No.: US 7,569,334 B2
Kobayashi et al.  (45) Date of Patent: *Aug. 4, 2009

(54) METHOD OF MANUFACTURING FOR CONDUCTIVE PATTERN SUBSTRATE

(75) Inventors: Hironori Kobayashi, Tokyo (JP); Yudai Yamashita, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/417,516

(22) Filed: Apr. 17, 2003

(65) Prior Publication Data

US 2004/0043334 A1 Mar. 4, 2004

(30) Foreign Application Priority Data

Apr. 18, 2002 (JP) .............................. 2002-115961

(51) Int. Cl.
*G03F 7/16* (2006.01)
*G03F 7/20* (2006.01)

(52) U.S. Cl. .................. 430/320; 430/322; 430/315; 430/324; 430/302; 430/330

(58) Field of Classification Search .................... 430/7, 430/320, 321, 322, 324, 330, 302, 315
See application file for complete search history.

(56) References Cited

U.S. PATENT DOCUMENTS

| 4,594,182 | A | * | 6/1986 | Hashimoto et al. ....... 252/519.3 |
| 2003/0087073 | A1 | * | 5/2003 | Kobayashi ................. 428/209 |
| 2004/0027514 | A1 | * | 2/2004 | Kobayashi et al. .......... 349/110 |

FOREIGN PATENT DOCUMENTS

| JP | 2000-249821 | 9/2000 |
| JP | 2001-345537 | 12/2001 |

OTHER PUBLICATIONS

English translation of JP 2000-249821, "Production of Patten Formed Body", Kobayashi et al., Sep. 2000.*

* cited by examiner

*Primary Examiner*—Mark F Huff
*Assistant Examiner*—Caleen O Sullivan
(74) *Attorney, Agent, or Firm*—Ladas & Parry LLP

(57) ABSTRACT

In the present invention, the problem of stability deterioration of the obtained conductive pattern substrate at the time of forming a conductive pattern by an additive method when a layer having reactivity remains on the substrate is to be solved. According to pattern exposure with a photo catalyst substrate 4 having a photo catalyst layer 3 laminated on a second substrate 5 superimposed onto a wettability changeable substrate 1 with a wettability changeable layer 3 laminated on a first substrate 2, a wettability pattern is formed. And furthermore, by adhering a conductive coating solution, or the like, a conductive pattern substrate without containing a photo catalyst can be manufactured.

5 Claims, 2 Drawing Sheets

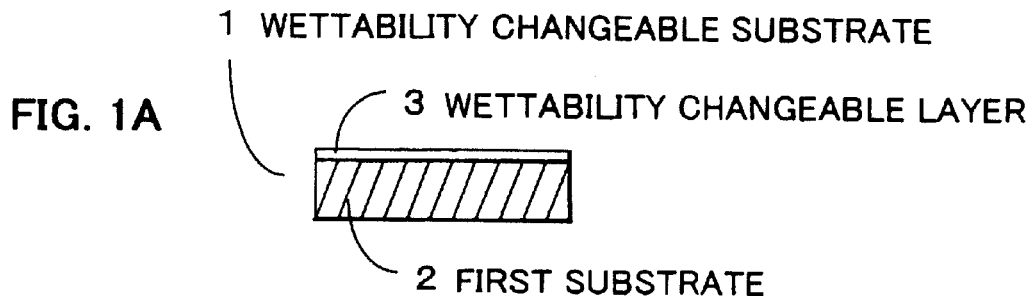
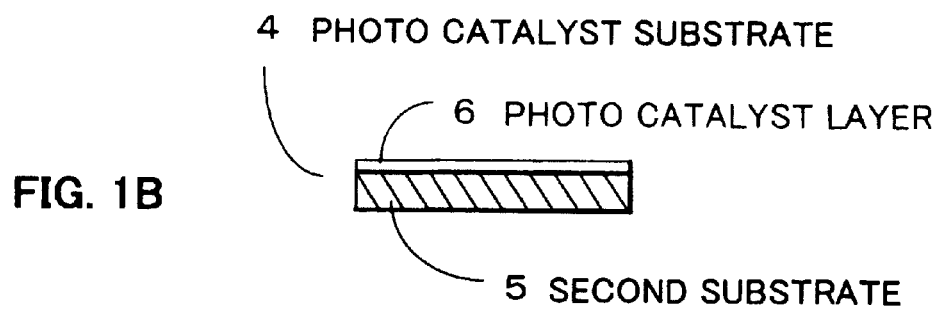
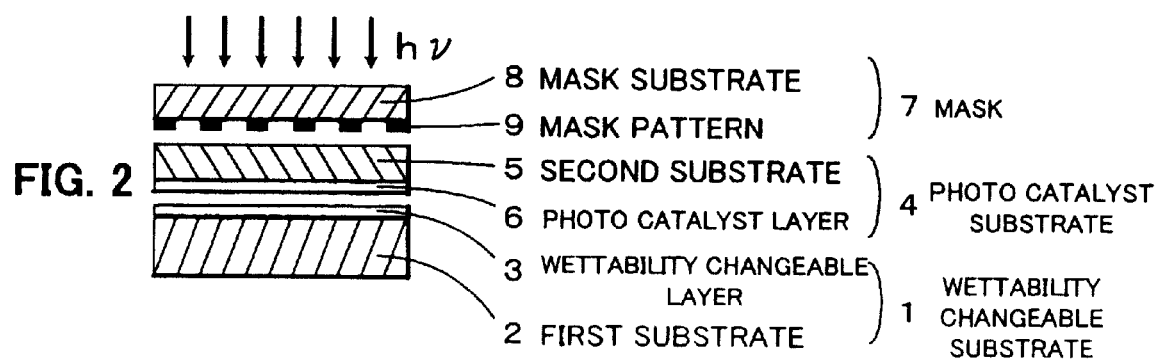
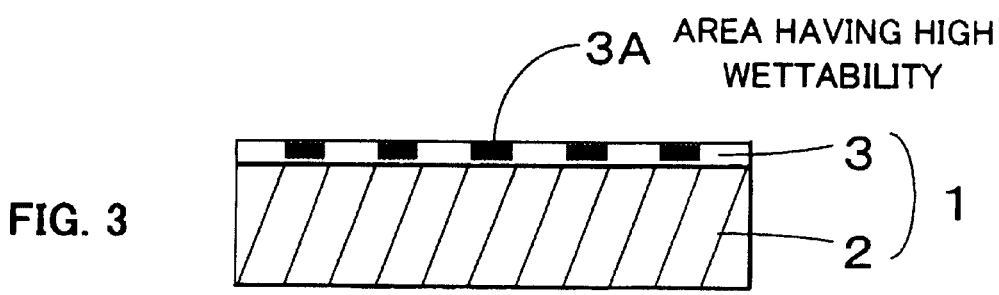

METHOD OF MANUFACTURING FOR CONDUCTIVE PATTERN SUBSTRATE

BACKGROUND OF THE INVENTION

1. Field of the Invention

The present invention relates to a manufacturing method for a conductive pattern substrate, capable of efficiently forming the conductive pattern based on the energy difference in the surface of the substrate at the time of forming a conductive pattern on the surface of a substrate.

2. Description of the Related Art

A conductive pattern substrate is used widely for various kinds of applications. For example, in liquid crystal displays, for the substrates for interposing a liquid crystal, the transparent electrode substrates with a transparent electrode for applying the electric potential to the liquid crystal per pixel formed in a pattern-like form, are used. Moreover, a wiring substrate with a conductive metal or a resin composition containing a conductive metal, formed in a pattern-like form such as wiring on the surface of an insulating substrate is used for an electronic circuit, or the like.

As to the method for forming a conductive pattern, there are various kinds of methods, such as a method of forming a conductive metal oxide thin film such as an ITO on the surface of a substrate by a gas phase method evenly on the entire surface, and then eliminating the unnecessary part by etching with a resist pattern of photo resist, and a method of printing with an ink composition containing a conductive metal powder, or the like on the surface of the substrate.

According to the former method of patterning by eliminating the conductive substance thin film formed evenly on the entire surface by etching with a resist pattern, it is advantageous in that a fine line can be formed, however, since the most of the conductive substance thin film is eliminated, it is disadvantageous in that the utilization efficiency of the conductive substance is low, the processing liquid for eliminating the conductive substance is needed, and furthermore, the eliminated conductive substance should be collected. Moreover, according to the latter method, although the ink composition can be adhered only in the necessary part, since the resolution is limited, this method is used for the case with relatively low resolution, which requires thick application.

Therefore, an additive formation method of a conductive pattern by adhering a conductive substance in only in a necessary part on the surface of the substrate is desired instead of subtractive formation method of eliminating the conductive substance thin film on the substrate surface as mentioned above.

Japanese Patent Application Laid Open (JP-A) No. 2001-345537 discloses a method for forming a conductive part by applying a compound capable of producing or erasing ion exchange groups by light beam irradiation on an insulating substrate, executing pattern exposure, and bonding metal ions or a metal with the formed ion exchange group pattern so that a conductive part can be formed by the additive method.

However, according to the above-mentioned method of the conventional technique, it is disadvantageous in that a part having the nature of producing or erasing the ion exchanging groups by the light beam irradiation remains so that the stability of the conductive pattern formed on the surface of the substrate is deteriorated.

SUMMARY OF THE INVENTION

Accordingly, an object of the present invention is to solve the problem of the instability derived from the residual nature of producing or erasing the ion exchanging groups by the light beam irradiation in the method of forming a pattern by producing or erasing ion exchanging groups by the light irradiation prior to the conductive pattern formation at the time of forming a conductive pattern by an additive method in the conventional technique.

The present inventors are able to eliminate the instability before and after exposure by additively adhering a conductive pattern utilizing a pattern based on the wettability difference, obtained by changing the surface wettability of for example a silicone using a photo catalyst, proposed before in the Japanese Patent Application Laid Open (JP-A) No. (2000-249821, supporting the silicone and the photo catalyst in this case on different substrates without coexisting on a common substrate, and reacting the same only at the time of exposure.

A first aspect of the present invention is a method for manufacturing a conductive pattern substrate comprising preparing a wettability changeable substrate having a wettability changeable layer made of a material with the surface wettability changeable by the function of the photo catalyst on a first substrate and a photo catalyst substrate having a photo catalyst layer made of a photo catalyst or a resin composition containing a photo catalyst laminated on a second substrate, disposing the photo catalyst substrate and the wettability changeable substrate such that the photo catalyst layer and the wettability changeable layer are contacted, or they are in the reactive distance, then irradiating a light beam in a pattern-like form so as to form a wettability pattern having an area having high wettability corresponding to the light beam irradiated part and an area having low wettability corresponding to the light beam unirradiated part on the wettability changeable layer surface, contacting a transparent conductive film forming composition with the wettability changeable layer with the wettability pattern formed on the entire surface so as to selectively adhere the transparent conductive film forming composition to the area having high wettability, and solidifying the adhered transparent conductive film forming composition so as to form a conductive pattern.

A second aspect of the present invention is a method for manufacturing a conductive pattern substrate comprising preparing a wettability changeable substrate having a wettability changeable layer made of a material with the surface wettability changeable by the function of the photo catalyst on a first substrate and a photo catalyst substrate having a photo catalyst layer made of a photo catalyst or a resin composition containing a photo catalyst laminated on a second substrate, disposing the photo catalyst substrate and the wettability changeable substrate such that the photo catalyst layer and the wettability changeable layer are contacted, or they are in the reactive distance, then irradiating a light beam in a pattern-like form so as to form a wettability pattern having an area having high wettability corresponding to the light beam irradiated part and an area having low wettability corresponding to the light beam unirradiated part on the wettability changeable layer surface, contacting a processing liquid containing metal ions or a compound of the metal with the wettability changeable layer with the wettability pattern formed so as to selectively adhere the processing liquid to the area having high wettability, and solidifying the adhered processing liquid so as to form a conductive pattern.

A third aspect of the present invention is a method for manufacturing a conductive pattern substrate comprising preparing a wettability changeable substrate having a wettability changeable layer made of a material with the surface wettability changeable by the function of the photo catalyst on a first substrate and a photo catalyst substrate having a photo catalyst layer made of a photo catalyst or a resin composition containing a photo catalyst laminated on a second substrate, disposing the photo catalyst substrate and the wettability changeable substrate such that the photo catalyst layer and the wettability changeable layer are contacted, or they are in the reactive distance, then irradiating a light beam in a pattern-like form so as to form a wettability pattern having an area having high wettability corresponding to the light beam irradiated part and an area having low wettability corresponding to the light beam unirradiated part on the wettability changeable layer surface, forming a thin film made of a conductive metal or a conductive metal oxide on the entire surface by the gas phase growth method to the wettability changeable layer with the wettability pattern formed, and then eliminating the part corresponding to the area having low wettability among the formed thin film so as to form a conductive pattern.

A fourth aspect of the present invention is the method for manufacturing a conductive pattern substrate according to the third aspect, wherein the gas phase growth method is any one selected from the group consisting of a chemical gas phase growth method, and a physical gas phase method including deposition, sputtering and an ion plating method.

A fifth aspect of the present invention is a method for manufacturing a conductive pattern substrate comprising preparing a wettability changeable substrate having a wettability changeable layer made of a material with the surface wettability changeable by the function of the photo catalyst on a first substrate and a photo catalyst substrate having a photo catalyst layer made of a photo catalyst or a resin composition containing a photo catalyst laminated on a second substrate, disposing the photo catalyst substrate and the wettability changeable substrate such that the photo catalyst layer and the wettability changeable layer are contacted, or they are in the reactive distance, then irradiating a light beam in a pattern-like form so as to form a wettability pattern having an area having high wettability corresponding to the light beam irradiated part and an area having low wettability corresponding to the light beam unirradiated part on the wettability changeable layer surface, superimposing a thermally fusible conductive layer transfer substrate with a thermally fusible conductive layer made of a thermally fusible substance containing a conductive substance laminated on a third substrate onto the wettability changeable layer with the wettability pattern formed such that the thermally fusible conductive layer side is to be contacted, and melting or softening the thermally fusible conductive layer so as to form a conductive pattern by selectively adhering the thermally fusible conductive layer onto the area having high wettability.

According to the present invention, prior to the conductive pattern formation by the additive method, since a photo catalyst for generating the wettability change used is supported on a substrate different from that of the wettability changeable substrate at the time of forming the wettability pattern on the wettability changeable layer of the wettability changeable substrate to serve as the substrate for forming the conductive pattern, a method for manufacturing a conductive pattern substrate without the change of the wettability changeable layer in the lower layer by the presence of the photo catalyst after the conductive pattern formation can be provided.

BRIEF DESCRIPTION OF THE DRAWINGS

FIG. 1 is a diagram for explaining a wettability changeable substrate and a photo catalyst substrate.

FIG. 2 is a diagram for explaining the state of exposing the wettability changeable substrate and the photo catalyst substrate in a superimposed state.

FIG. 3 is a diagram for explaining the wettability changeable substrate after exposure.

DESCRIPTION OF THE PREFERRED EMBODIMENT

Figure 4A:
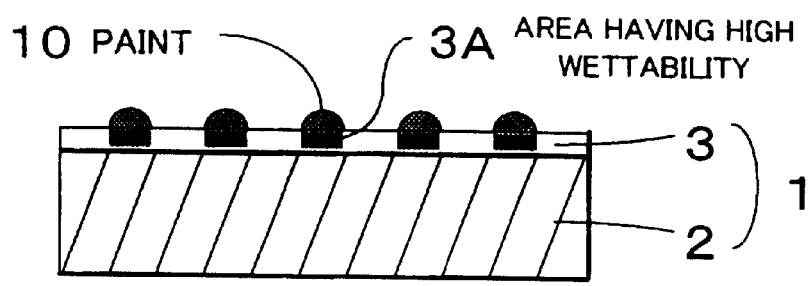
FIG. 4 is a diagram for explaining the state with a paint coated on the wettability changeable substrate after exposure.

FIGS. 1 to 5 are diagrams for conceptually explaining a method for manufacturing a conductive pattern substrate according to the present invention. First, in the present invention, a wettability changeable substrate to serve as the material for providing a conductive pattern substrate, and a photo catalyst substrate used for controlling the wettability of the wettability changeable substrate are prepared.

As shown in FIG. 1A, a wettability changeable substrate 1 comprises a wettability changeable layer 3 laminated on a substrate 2 (for distinguishing the same form the other substrates, it is referred to as the first substrate). The materials comprising each layer will be explained later. The substrate 2 is for example an insulating substrate, and the wettability changeable layer 3 is made of a silicone resin.

Moreover, as shown in FIG. 1B, a photo catalyst substrate 4 comprises a photo catalyst layer 6 laminated on a substrate 5 other than the substrate 1 (it is referred to as the second substrate). The substrate is for example a glass substrate, and the photo catalyst layer is for example an inorganic paint dry film containing a titanium dioxide.

Next, as shown in FIG. 2, with the above-mentioned wettability changeable substrate 1 and photo catalyst substrate 4 superimposed with each other such that the wettability changeable layer 3 and the photo catalyst layer 6 are contacted, exposure is carried out via a mask 7 from the substrate 5 side of the photo catalyst substrate 4.

As shown in FIG. 3, according to the exposure, a wettability pattern having regions with different wettabilities, that is, a part of an area having high wettability 3A generated by the surface energy change in the exposed part in the exposed surface of the wettability changeable layer 3, and a remaining part having relatively low wettability in an unexposed part is formed. It is considered that the wettability pattern is formed by the exposure under the existence of the photo catalyst due to oxidation, decomposition, or the like of an organic group as a part of the component of the wettability changeable layer 3 by the function of the photo catalyst.

Figure 4B:
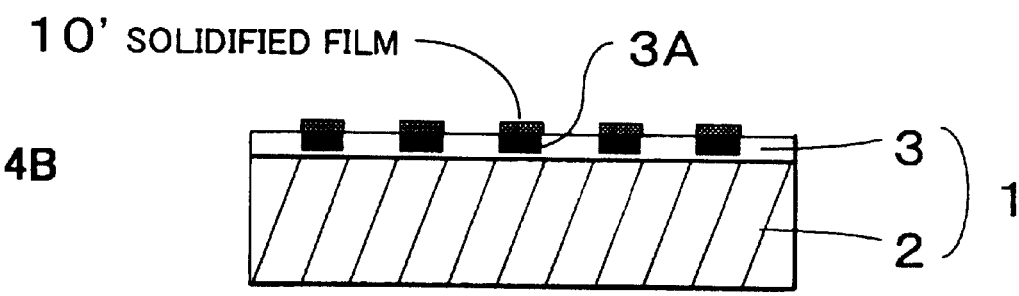

As shown in FIG. 4A, since the water wettability is good in the area having high wettability 3A compared with the other area, a paint 10 such as an aqueous solution and a water dispersion is adhered selectively so that a solidified film 10' with the solid component contained in the aqueous solution, the water dispersion, or the like solidified remains on the coloring area 3A having high wettability by solidifying the adhered coated film by drying, heating, or the like as shown in FIG. 4B. By utilizing the phenomenon, by containing an appropriate metal, or the like in the aqueous solution, the water dispersion, or the like by dissolving, dispersion, or the like, a metal pattern corresponding to the light transmissible part of the mask 7 at the time of the exposure can be formed on the wettability changeable layer 3.

Figure 5A:
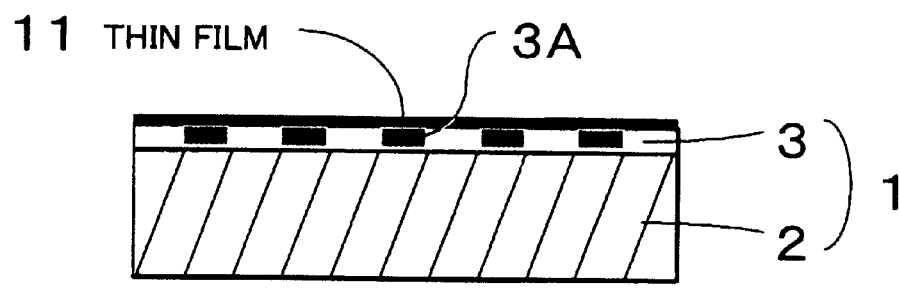
FIG. 5 is a diagram for explaining the state with a thin film used for the wettability changeable substrate after exposure.
Figure 5B:
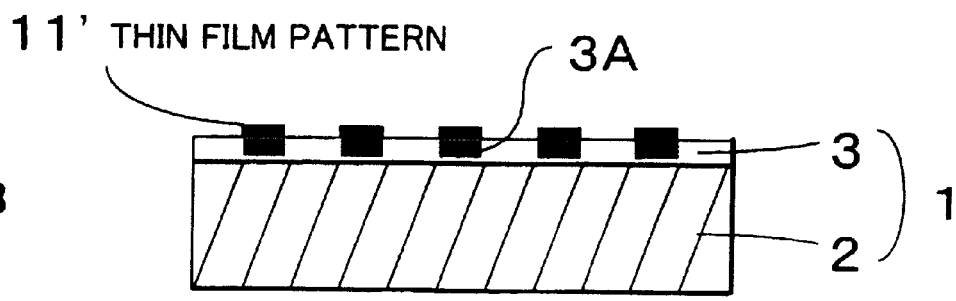

As shown in FIG. 5A, at the time of forming a thin film 11 of a metal, or the like by an ordinary thin film forming method, it is adhered uniformly also in the area other than the area having high wettability 3A. However, since the adhesiveness of the thin film 11 and the wettability changeable layer 3 is high in the area having high wettability 3A and the adhesiveness is low in the other area, by applying a force for peeling off the thin film to the adhered thin film 11, the thin film 11 at the part other than the area having high wettability 3A is peeled off, and as a result, a thin film pattern 11' formed by having the thin film 11 remaining only on the area having high wettability 3A can be formed on the wettability changeable layer 3 as shown in FIG. 5B.

The above-mentioned is conceptual explanation for the present invention, and thus the kind of the aqueous solution and the water dispersion, the kind and the formation method for the thin film can be various in the above description, and furthermore, the application form of the material used at the time of forming a pattern, utilizing the wettability pattern formed on the surface of the wettability changeable layer 3 can be various as well.

As the first substrate 2 for supporting the wettability changeable layer 3, one capable of providing a substrate for a conductive pattern substrate to be finally obtained is selected and used. According to the present invention, since the conductive pattern can be obtained by drying or baking the aqueous solution or the water dispersion adhered selectively on the wettability changeable layer 3 at the time of solidification, it is preferable to select and use one capable of enduring the processing condition in the conductive pattern manufacturing process, in particular, the heating or baking condition. As the specific material, a resin made of a thermoplastic resin or a thermosetting resin, a woven fabric or a non-woven fabric, a ceramics, a glass, or a metal can be presented. A film, a sheet, or a plate-like material made of these materials can be used. The above-mentioned materials can be used alone or in a combination. When exposure of the wettability changeable layer 3 is executed from the photo catalyst substrate 4 side, the substrate 2 needs not always transmit the exposure light beam.

The wettability changeable layer 3 has the surface characteristic of the layer 3, in particular, the surface energy is changed by the light beam irradiation under the presence of the photo catalyst, specifically, it has the wettability change. More practically, it is a layer having the water contact angle lowered.

According to the wettability changeable layer 3, at the time a light beam is irradiated under the presence of the photo catalyst, it is preferable that the water contact angle in the part without the irradiation (hereinafter it is referred also as the unexposed part) is 50° or more, more preferably 60° or more, and particularly preferably 70° or more. Moreover, at the time a light beam is irradiated under the presence of the photo catalyst, it is preferable that the water contact angle in the irradiated part (hereinafter it is referred also as the exposed part) is 40° or less, more preferably 30° or less, and particularly preferably 20° or less.

The contact angle measured was carried out using a contact angle measuring device (CA-Z type manufactured by Kyowa Interface Science Co., LTD.) as the results or a graph of the results of measurement at 30 seconds after dropping liquid droplets from a micro syringe. Moreover, at the time of the measurement, as the liquids having the various surface tensions, wetting index reference liquids manufactured by JUNSEI CHEMICAL CO., LTD. were used.

According to the present invention, since a liquid containing a metal material comprising a metal pattern is functioned, utilizing the wettability change, it is preferable that the contact angle of the liquid used there has actually the above-mentioned contact angle value of water.

As the specific materials comprising the wettability changeable layer 3, it is preferable to use one capable of generating the above-mentioned change by the light beam irradiation under the presence of the photo catalyst and hardly generating deterioration or decomposition by the light beam irradiation under the present of the photo catalyst. Specifically, an organo polysiloxane is suitable, and it is more preferable to use in particular an organo polysiloxane having a fluoro alkyl group. More specifically, (1) an organo polysiloxane to provide high strength by hydrolysis or polycondensation of a chloro or alkoxy silane, or the like by the sol-gel reaction, or the like, (2) an organo polysiloxane obtained by cross-linking a reactive silicone having the excellent water repellent property or oil repellent property (both referred to as the liquid repellent property), or the like can be presented.

In the above-mentioned case (1), it is preferably an organo polysiloxane as a hydrolyzed condensation product or a co-hydrolyzed condensation product of one or two or more kinds of silicon compounds represented by the general formula (1):

$$Y_n SiX_{(4-n)} \qquad (1).$$

(Wherein, Y is an alkyl group, a fluoro alkyl group, a vinyl group, an amino group, a phenyl group or an epoxy group, and X is an alkoxyl group, an acetyl group or a halogen. The subscript n of Y and n in the subscript 4-n of X are an integer from 0 to 3.). Here, the number of carbon atoms of the group represented by Y is preferably in a range of 1 to 20. Moreover, the alkoxy group represented by X is preferably a methoxy group, an ethoxy group, a propoxy group, or a butoxy group.

Moreover, in particular, a polysiloxane containing a fluoro alkyl group can be used preferably. Specifically, a hydrolyzed condensation product or a co-hydrolyzed condensation product of one or two or more kinds of the following fluoro alkyl silanes can be presented. Those known in general as a fluorine based silane coupling agent can be used.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)$;
$CF_3(CF_2)_5CH_2CH_2Si(OCH_2CH_3)$;
$CF_3(CF_2)_7CH_2CH_2Si(OCH_2CH_3)_3$;
$CF_3(CF_2)_9CH_2CH_2Si(OCH_2CH_3)_3$; and
$CF_3(CF_2)_7SO_2N(C_2H_5)C_2H_4CH_2Si(OCH_3)_3$.

By using the polysiloxane containing the above-mentioned fluoro alkyl group as the binder, the liquid repellent property of the unexposed part of the wettability changeable layer 3 can be improved dramatically so that a function of preventing adhesion of a liquid containing a metal material comprising a metal pattern can be realized.

Moreover, as the above-mentioned reactive silicone (2), compounds having a skeleton represented by the following general formula (2) can be presented.

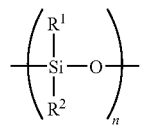

(2)

Wherein, n is an integer of 2 or more, $R^1$, $R^2$ each are a substituted or non substituted alkyl, alkenyl, aryl or cyano alkyl group having 1 to 10 carbon atoms, and 40% or less of the entirety based on the molar ratio is a vinyl, a phenyl, or a halogenated phenyl. Moreover, those having $R^1$, $R^2$ as a methyl group are preferable since the surface energy becomes smallest, and it is preferable that a methyl group accounts for 60% or more based on the molar ratio. Moreover, at least one reactive group such as a hydroxyl group is provided in a molecular chain at the chain end or the side chain.

Moreover, together with the above-mentioned organo polysiloxane, a stable organo silicon compound not to have the cross-linking reaction such as a dimethyl polysiloxane can be mixed therewith.

It is preferable that the wettability changeable layer 3 in the present invention contains a fluorine in the layer 3 such that the fluorine content in the surface of the layer 3 is lowered at the time the light beam is irradiated under the presence of the photo catalyst with respect to the content before the irradiation. Specifically, it is preferable that the fluorine content in the liquid-philic region having a low fluorine content is 10 or less with respect to the fluorine content in the region without the light beam irradiation as 100, more preferably 5 or less, particularly preferably 1 or less.

The measurement of the fluorine content in the wettability changeable layer 3 can be carried out by a common measuring method, such as the X-ray photoelectron spectroscopy (or the ESCA), the fluorescent X-ray analysis method, and the mass analysis method.

As it is known, since a fluorine has an extremely low surface energy, the surface of a substance having a high fluorine content has a small critical surface tension. On the contrary, since the surface of a substance having a low fluorine content has a large critical surface tension, it becomes more liquid-philic, for example, hydrophilic so that a liquid-philic pattern can be formed on the liquid repellent surface, and thus a highly sophisticated conductive pattern can be formed.

Accordingly, in the present invention, it is preferable to contain a fluorine in the wettability changeable layer 3, and it is preferable to provide the wettability changeable layer 3 by containing a fluorine in a material hardly generating deterioration or decomposition by the light beam irradiation under the presence of the photo catalyst, specifically an organo polysiloxane.

In order to contain a fluorine in a polysiloxane, (A) a method of bonding a fluorine compound to a principal agent having in general a high bonding energy by relatively weak bonding energy, (B) a method of mixing a fluorine compound bonded by relatively weak bonding energy into the wettability changeable layer, or the like can be presented. By introducing a fluorine accordingly, when a light beam is irradiated under the presence of the photo catalyst, first the fluorine bonding portion having relatively weak bonding energy is decomposed, and thereby the fluorine can be eliminated from the wettability changeable layer.

As the above-mentioned method (A) of bonding a fluorine compound to a binder having high bonding energy by relatively weak bonding energy, a method of introducing a fluoro alkyl group to the above-mentioned organo polysiloxane as the substituent, or the like can be presented.

As mentioned above, an organo polysiloxane can be obtained by the hydrolysis, or the polycondensation of a chloro or alkoxy silane, or the like by the sol-gel reaction, or the like. More specifically, it can be obtained by the hydrolyzed condensation or the co-hydrolyzed condensation of one or two or more kinds of silicon compounds represented by the general formula (1):

$$Y_n SiX_{(4-n)} \tag{1}$$

(Wherein, Y is an alkyl group, a fluoro alkyl group, a vinyl group, an amino group, a phenyl group or an epoxy group, and X is an alkoxyl group, an acetyl group or a halogen. The subscript n of Y and n in the subscript 4-n of X are an integer from 0 to 3.) Here, by the synthesis using a silicon compound having a fluoro alkyl group as the substituent Y in the above-mentioned general formula (1), an organo polysiloxane having a fluoro alkyl group as a substituent can be obtained.

By providing the wettability changeable layer 3 using such an organo polysiloxane having a fluoro alkyl group as the substituent as the binder, at the time a light beam is irradiated under the presence of the photo catalyst, since the carbon bond part of the fluoro alkyl group is decomposed, the fluorine content in the surface of the wettability changeable layer 3 in the exposed part can be reduced.

As the organo polysiloxane having a fluoro alkyl group as the substituent in the above-mentioned description, it is not particularly limited as long as it has a fluoro alkyl group, and an organo polysiloxane having at least one fluoro alkyl group, preferably with the fluoro alkyl group having 4 to 30 carbon atoms, more preferably 6 to 20 carbon atoms, and particularly preferably 6 to 16 carbon atoms can be used preferably. Although specific example of such the silicon compound is as explained above, it is preferably the above silicon compound having fluoro alkyl group having 6 to 8 carbon atoms, i.e. fluoroalkylsilane especially.

It is possible to use such a silicon compound having a fluoro alkyl group as a mixture with the above-mentioned silicon compound not having a fluoro alkyl group, and use the co-hydrolyzed condensation product of them as the above-mentioned organo polysiloxane, or to use one or two or more kinds of the silicon compounds having a fluoro alkyl group, and use the hydrolyzed condensation product, and the co-hydrolyzed condensation product as the above-mentioned organo polyslioxane.

According to an organo polysiloxane having a fluoro alkyl group accordingly obtained, among the silicon compound comprising the organo polysiloxane, it is preferable that the above-mentioned silicon compound having a fluoro alkyl group is contained by 0.01 mole % or more, and more preferably by 0.1 mole % or more. By containing the fluoro alkyl group to this extent, the liquid repellent property on the wettability changeable layer 3 can be improved so that the wettability difference with respect to the part provided as the liquid-philic area by the light beam irradiation in the presence of the photo catalyst can be made larger.

The organo polysiloxane can be obtained not only by the method (1) of the hydrolysis, or the polycondensation of a chloro or alkoxy silane, or the like by the sol-gel reaction, or the like, but also by the method (2) of cross-linking a reactive silicone having the excellent liquid repellent property. Also in the latter case, a fluorine can be contained in the wettability changeable layer 3 by having either one or both of $R^1$, $R^2$ in the above-mentioned general formula (2) as a substituent containing a fluorine such as a fluoro alkyl group. Moreover, when a light beam is irradiated under the presence of the photo catalyst, since the fluoro alkyl group part having bonding energy lower than that of the siloxane bond is decomposed, the fluorine content in the surface of the wettability changeable layer 3 can be lowered with respect to the part without the irradiation.

As another method for containing a fluorine in an organo polysiloxane, that is, as a method (B) for mixing a fluorine compound bonded by relatively weak bonding energy in the wettability changeable layer 3, for example, in the case of introducing a low molecular weight fluorine compound, for example, a method of mixing a fluorine based surfactant, or the like can be presented. Moreover, as a method for introducing a high molecular weight fluorine compound, a method of mixing a fluorine resin having high compatibility with the binder resin, or the like can be presented.

For the wettability changeable layer 3 in the present invention, a surfactant can be contained further. Specifically, hydrocarbon based surfactants (such as product name; NIKKOL BL, BC, BO, BB series manufactured by Nikko Chemicals Co., Ltd.), fluorine based or silicone based nonionic surfactants (such as product name; ZONYL FSN, or FSO manufactured by Dupont, product name; SARFRON S-141, or 145 manufactured by Asahi Glass Company, product name; MAGAFACE F-141, or 144 manufactured by Dainippon Ink and Chemicals, Incorporated, product name; FTERGENT F-200, or F251 manufactured by Neos, product name; UNIDYNE DS-401, or 402 manufactured by DAIKIN INDUSTRIES, Ltd., and product name; FLUORAD FC-170, or 176 manufactured by 3M., or the like) can be presented. Moreover, cationic surfactants, anionic surfactants, amphoteric surfactants can be used as well.

Moreover, for the wettability changeable layer 3, in addition to the above-mentioned surfactants, oligomers and polymers, such as a polyvinyl alcohol, an unsaturated polyester, an acrylic resin, a polyethylene, a diallylphthalate, an ethylene propylene diene monomer, an epoxy resin, a phenol resin, a polyurethane, a melamine resin, a polycarbonate, a polyvinyl chloride, a polyamide, a polyimide, a styrelenebutadiene rubber, a chloroprene rubber, a polypropylene, a polybutylene, a polystyrene, a polyvinyl acetate, a polyester, a polybutadiene, a polybenzimidazol, a polyacrylic nitrile, an epichlorohydrine, a polysulfide, and a polyisoprene can be contained.

The wettability changeable layer 3 can be formed by dispersing the above-mentioned components in a solvent as needed with the other additives so as to prepare a coating solution, and coating the coating solution onto the substrate 2. As the solvent to be used, alcohol based organic solvents such as an ethanol, and an isopropanol are preferable. The coating operation can be carried out by a known coating method such as spin coating, spray coating, dip coating, roll coating and bead coating. When a ultraviolet ray hardening type component is contained, the wettability changeable layer can be formed by executing a hardening process by irradiating an ultraviolet ray. The wettability changeable layer 3 can be laminated either on the entire surface of the substrate 2 or as needed in a part thereof.

The thickness of the wettability changeable layer 3 is preferably in a range of 0.001 μm to 1 μm in terms of the wettability change speed by the photo catalyst, or the like, and it is particularly preferably in a range of 0.01 μm to 0.1 μm.

The photo catalyst substrate 4 to be used in a combination with the wettability changeable substrate 1, which is prepared independently of the wettability changeable substrate 1, comprises the photo catalyst layer 6 on the substrate 5. The photo catalyst layer 6 may comprise either the photo catalyst alone or the photo catalyst and the binder resin. When the photo catalyst layer 6 comprises the photo catalyst alone, the efficiency for causing the wettability change in the wettability changeable layer 3 is large so that it is advantageous in terms of the processing time for forming the wettability pattern in the wettability changeable layer 3, or the like. Furthermore, when it comprises the photo catalyst and the binder resin, it is advantageous in the formation of the photo catalyst layer 6.

As the photo catalyst, any one can be used as long as it can change the surface wettability of the above-mentioned wettability changeable layer 3 at the time of the light beam irradiation. Those known as photo semiconductors, such as a titanium oxide ($TiO_2$), a zinc oxide (ZnO), a tin oxide ($SnO_2$), a strontium titanate ($SrTiO_3$), tungsten oxide ($WO_3$), bismuth oxide ($Bi_2O_3$), and an iron oxide ($Fe_2O_3$) can be presented, and one or two or more kinds as a mixture can be selected and used from them.

According to the present invention, in particular, a titanium oxide can be used preferably since it has high band gap energy, it is chemically stable without the toxicity, and it can be obtained easily. There are an anatase type and a rutile type in the titanium oxides, and either can be used in the present invention, and the anatase type titanium oxide is preferable. The anatase type titanium oxide has a 380 nm or less excitation wavelength.

As the anatase type titanium oxide, for example, a hydrochloric acid peptization type anatase type titania sol (STS-02 (average particle size 7 nm) manufactured by Ishihara Sangyo Kaisha, Ltd., or ST-K01 manufactured by Ishihara Sangyo Kaisha, Ltd.), a nitric acid peptization type anatase type titania sol (TA-15 (average particle size 12 nm) manufactured by Nissan Chemical Industries, Ltd.), or the like can be presented.

With a smaller particle size of the photo catalyst, the photo catalyst reaction can be generated effectively, and thus it is preferable. An average particle size of 50 nm or less is preferable, and use of a photo catalyst of 20 nm or less is particularly preferable.

As the method for forming the photo catalyst layer 6 comprising only the photo catalyst, for example, a sputtering method, a CVD method, a method of using a vacuum film formation method such as a vacuum deposition method, or the like can be presented. By forming the photo catalyst layer 6 by the vacuum film formation method, a photo catalyst layer 6 of an even film containing only the photo catalyst can be presented. Since the wettability on the wettability changeable layer 3 can be changed evenly thereby, and furthermore, it comprises only the photo catalyst, the wettability on the wettability changeable layer 3 can be changed efficiently compared with the case of using a binder.

Moreover, as another example of a method for forming a photo catalyst layer 6 comprising only the photo catalyst, for example, when the above-mentioned photo catalyst is a titanium dioxide alone, a method of forming an amorphous titania on the substrate 5, and then having the phase change to a crystalline titania by baking, or the like can be presented. The amorphous titania used here can be obtained by for example, hydrolysis or dehydration condensation of an inorganic salt of a titanium such as a titanium tetrachloride, and a titanium sulfide, or hydrolysis or dehydration condensation of an organic titanium compound such as a tetraethoxy titanium, a tetraisopropoxy titanium, a tetra-n-propoxy titanium, a tetrabutoxy titanium, and a tetramethoxy titanium under the presence of an acid. Then, it is modified to an anatase type titania by baking at 400° C. to 500° C., or to a rutile type anatase by baking at 600° C. to 700° C.

When the photo catalyst layer 6 is provided by using a binder, it is preferable that the principal skeleton of the binder has high bonding energy so as not to be decomposed by the photo excitation of the above-mentioned photo catalyst. As such a binder, for example, an organo polysiloxane explained in detail for the above-mentioned description of the wettability changeable layer 3, or the like can be presented.

When an organo polysiloxane is used as the binder for the formation of the photo catalyst layer 6, it can be formed by preparing a coating solution by dispersing the photo catalyst and the organo polysiloxane as the binder in a solvent as needed together with other additives, and coating the coating solution onto the substrate 5. The solvent to be used at the time of forming the photo catalyst layer 6 by coating, the coating method, handling in the case of containing an ultraviolet ray hardening type component as the binder, or the like are same as the above-mentioned formation of the wettability changeable layer 3.

For the formation of the photo catalyst layer 6, as the binder, an amorphous silica precursor can be used. The amorphous silica precursor is represented by the general formula (3) $SiX_4$, preferably it is a silicone compound $SiX_4$ wherein X is a halogen, a methoxy group, an ethoxy group, an acetyl group, or the like, a silanol as a hydrolysis product thereof, or a polysiloxane having a 3,000 or less average molecular weight.

Specifically, a tetraethoxy silane, a tetraisopropoxy silane, a tetra-n-propoxy silane, a tetrabutoxy silane, a tetramethoxy silane, or the like can be presented. Moreover, in this case, the photo catalyst layer 6 can be formed by homogeneously dispersing a precursor of an amorphous silica and photo catalyst particles in a non-water based solvent, forming a silanol on the substrate 5 by the hydrolysis by the moisture content in the air, and dehydration polycondensation at a room temperature. When the dehydration polycondensation of the silanol is executed at 100° C. or more, the polymerization degree of the silanol is heightened so that the strength of the film surface can be improved. Moreover, as the bonding agent thereof, one or two or more kinds as a mixture can be used.

The photo catalyst content in the photo catalyst layer 6 can be set in a range of 5 to 60% by mass, and preferably in a range of 20 to 40% by mass. Moreover, the thickness of the photo catalyst layer 6 is preferably in a range of 0.05 to 10 µm. The photo catalyst layer 6 can be laminated either on the entire surface of the substrate 5, or as needed partially.

Furthermore, in the photo catalyst layer 6, in addition to the above-mentioned photo catalyst and binder, a surfactant may be included. Specifically, the same surfactants explained to be contained in the wettability changeable layer 3 can be used.

Moreover, in the photo catalyst layer 6, in addition to the surfactant, the oligomers, polymers, or the like explained to be contained in the wettability changeable layer 3 can be contained.

As the substrate 5 to have the photo catalyst layer 6 laminated, when the exposure is carried out from the photo catalyst substrate 4 side with the photo catalyst substrate 4 superimposed with the wettability changeable substrate 1, the substrate 5 needs to have the nature for transmitting the exposure light beam. As mentioned above, when the photo catalyst is an anatase type titanium dioxide, since the excitation wavelength is 380 nm or less, those made of an ultraviolet ray transmitting type material can be used, and plate-like substances comprising a transparent rigid member without flexibility such as a quartz glass, a low expansion borosilicate glass (such as Pyrex (registered trademark), and a synthetic quartz plate, and those made of a flexible material such as a transparent resin film and an optical resin plate, can be presented. When the exposure is carried out from the wettability changeable substrate 1 side, the substrate 2 of the wettability changeable substrate 1 needs to have the nature for transmitting the exposure light beam. In this case, the substrate 5 of the photo catalyst substrate 4 needs not always transmits the exposure light beam.

At the time of explaining the outline of the method for manufacturing the conductive pattern substrate of the present invention, as shown in FIG. 2, although it has been described that exposure is carried out from the substrate 5 side of the photo catalyst substrate 4 via the mask 7 with the wettability changeable substrate 1 and the photo catalyst substrate 4 superimposed with each other such that the wettability changeable layer 3 and the photo catalyst layer 6 are contacted, there are several variations for the superimposition and the exposure.

First, at the time of the exposure, although the wettability changeable substrate 1 and the photo catalyst substrate 4 can be contacted closely, but they can also be in a state facing with each other with an extremely short distance provided therebetween without closely contacting with each other. Moreover, in the latter case, it is necessary to dispose the wettability changeable layer 3 and the photo catalyst layer 6 in the reactive distance of them. As the distance to have them in the reactive distance, 200 µm or less is preferable. Since the generated active oxygen species can reach the surface of the wettability changeable layer 3 easily with a smaller distance, the change speed can be made higher. In contrast, since the generated active oxygen species can hardly reach the surface of the wettability changeable layer 3 with a larger distance, the change speed can be made lower, or change is not brought about.

In the present invention, the above-mentioned distance is in particular in a range of 0.2 µm to 10 µm, and preferably in a range of 1 µm to 5 µm in consideration of extremely good pattern accuracy with high photo catalyst sensitivity and good wettability change efficiency of the wettability changeable layer 3. such a distance range is particularly effective for a wettability changeable layer 3 of a small area capable of controlling the distance by high accuracy.

In contrast, when a wettability changeable layer 3 of a large area of for example 300 mm×300 mm, it is extremely difficult to form the above-mentioned fine gap between the photo catalyst layer 6 and the wettability changeable layer 3 without contact. Therefore, when the wettability changeable layer 3 has a relatively large area, the above-mentioned gap is in a range of 10 to 100 µm, and particularly preferably in a range of 50 to 75 µm. By having the gap in the range, a problem of the pattern accuracy decline of blurring of the wettability pattern, or the like, or a problem of deterioration of the wettability change efficiency due to deterioration of the photo catalyst sensitivity, or the like can be prevented, and furthermore, the effect of preventing generation of irregularity in the wettability change on the wettability changeable layer 3 can be provided.

At the time of exposing the wettability changeable layer 3 of a relatively large area, it is preferable to set the gap by a positioning device for the photo catalyst substrate 4 and the wettability changeable layer 3 in the exposing unit in a range of 10 µm to 200 µm, and in particular in a range of 25 µm to 75 µm. By having the setting value in the range, drastic decline of the pattern accuracy or drastic deterioration of the photo catalyst sensitivity can be prevented, and furthermore, the photo catalyst layer 6 and the wettability changeable layer 3 can be disposed without contact.

By disposing the photo catalyst layer 6 and the wettability changeable layer 3 surface with a predetermined distance provided therebetween, the active oxygen species generated by the oxygen, water and the photo catalyst function can easily be desorbed. That is, when the distance between the photo catalyst layer 6 and the wettability changeable layer 3 is made narrower than the above-mentioned range, the above-mentioned active oxygen species desorption can hardly be carried out, and as a result, the wettability change speed may be made slower, and thus it is not preferable. Moreover, when the distance is made wider than the above-mentioned range, the generated active oxygen species can hardly reach the wettability changeable layer 3, the wettability change speed may be made slower also in this case, and thus it is not preferable either.

As such a method for disposing the photo catalyst layer 6 and the wettability changeable layer 3 with an extremely narrow gap formed evenly, for example, a method of using a spacer can be presented. Then, by using the spacer accordingly, since an even gap can be formed, and furthermore, the part to be contacted with the spacer does not have the photo catalyst function on the wettability changeable layer 3 surface, a predetermined wettability pattern can be formed on the wettability changeable layer 3 by having the same pattern in the spacer as the above-mentioned wettability pattern. Moreover, by using the spacer, since the active oxygen species generated by the photo catalyst function can reach the wettability changeable layer 3 surface with a high concentration without diffusing, a highly sophisticated wettability pattern can be formed efficiently.

According to the present invention, the disposition state of the photo catalyst substrate 4 needs to be maintained at least during the exposure.

In contrast, when the wettability changeable substrate 1 and the photo catalyst substrate 4 are closely contacted with each other, the pattern accuracy and the reproducibility can be excellent.

Moreover, although exposure is carried out via a mask in the above-described explanation, it is just a method for executing pattern exposure, and thus it is not limited thereto. Moreover, although the mask is prepared independently of the wettability changeable substrate 1 and the photo catalyst substrate 4 in the above-described explanation, and it has the mask pattern 9 on the mask substrate 8, as the mask pattern 9, one formed on either the wettability changeable substrate 1 or the photo catalyst substrate 4 can be utilized. Alternatively instead of the exposure executed via a mask, a method of scanning with an exposure beam as in the case of manufacturing a photo mask for the semiconductor manufacturing can be employed as well, and any method capable of executing a pattern exposure can be used as well.

When the photo catalyst is an anatase type titanium dioxide, since the excitation wavelength is 380 nm or less, an exposure light beam having the peak at 380 nm or less can be used so that exposure can be carried out using an ultraviolet ray light source used for the exposure. That is, exposure can be carried out using various kinds of ultraviolet ray lamps such as a mercury lamp, a metal halide lamp, a xenon lamp and an excimer lamp, or a laser light source for scanning such as an excimer and a YAG, or the like.

Since the wettability pattern generated on the surface of the wettability changeable layer 3 by the exposure has the nature of selectively adhering various kinds of aqueous solutions, water dispersions, or the like, by utilizing the phenomenon, a conductive pattern can be formed in the wettability changeable layer 3 of the wettability changeable substrate 1 with the wettability pattern generated using various substances of various kinds of forms other than the aqueous solutions, the water dispersions, or the like as described in the following (1) to (4).

That is, (1) a transparent conductive film forming coating solution, (2) a processing liquid containing metal ions or a metal compound, (3) a thin film of a conductive metal or a conductive metal oxide formed by the gas phase growth method, (4) a thermally fusible conductive layer transfer substrate having a thermally fusible conductive layer as the transfer layer (for example, a transfer sheet), or the like, can be presented.

As the (1) transparent conductive film forming coating solution, for example, a coating solution made of a dispersion prepared by dispersing an alkaline partially hydrolyzed product of an inorganic indium compound and an inorganic tin compound in an acidic aqueous solution with an indium compound or a tin compound dissolved, and adding a film forming auxiliary agent made of an inorganic indium compound and an organic tin compound can be presented as an example. By coating the coating solution on the wettability changeable layer 3 of the wettability changeable substrate 1 with the wettability pattern generated, and applying successively the processes of drying and baking, a conductive pattern having a high light transmissivity and a high conductivity can be formed on the wettability changeable substrate 1.

As the coating means for the above-mentioned (1) transparent conductive film forming coating solution, for example, it is preferable to use a screen printing method, a roll coating method, a dip coating method, a spin coating method, or the like. Moreover, it is preferable to carry out the drying process after applying the coating solution on the wettability changeable substrate 1 in the air of 30 to 60° C. for 30 minutes or more. The baking process of the coating film can be carried out at the decomposition temperature of the transparent conductive film forming substance or more and the thermal deformation temperature of the substrate 2 of the wettability changeable substrate 1 or less, and it is preferable to carry out the same at 400 to 800° C. for 1 hour or more.

The alkaline partially hydrolyzed product of an inorganic indium compound and an inorganic tin compound used at the time of manufacturing the above-mentioned specific examples of the (1) transparent conductive film forming coating solution can be manufactured by a method of gradually dropping a base such as an ammonium water into the solution with the water soluble inorganic indium compound and inorganic tin compound dissolved so as to have the solution pH at 8 to 9 for co-precipitating the indium and the tin as hydroxide fine particles.

As the water soluble inorganic indium compound and inorganic tin compound, a mineral acid salt of an indium and a tin is preferable. For example, $In_2(SO_4)_3$, $InCl_3$, $In(NO_3)_3$, $Sn(SO_4)$, $Sn(SO_4)_2$, $SnCl_2$, $SnCl_4$, $Sn(NO_3)_2$, $Sn(NO_3)_4$, or the like can be presented. Moreover, these compounds may be a hydrate.

The concentration of the aqueous solution containing the above-mentioned inorganic indium compound and inorganic tin compound is about 1 to 15% (based on the mass, and the same is applied hereinafter) by the total of the inorganic indium compound and the inorganic tin compound. Moreover, as to the inorganic indium compound and the inorganic tin compound in the aqueous solution, the ratio of the number of atoms of the tin with respect to the number of total atoms of the indium and the tin $\{Sn \times 100/(In+Sn)\}$ is preferably about 1 to 30%, and it is more preferably 5 to 20%.

The fine particles of the alkaline partially hydrolyzed product of the inorganic indium compound and the inorganic tin compound obtained by the co-precipitation are washed with water after centrifugal separation, and dispersed in the undried state in an acidic aqueous solution with the indium compound or the tin compound dissolved so as to prepare a dispersion.

As the acidic aqueous solution for dissolving the indium compound or the tin compound, for example, an acidic aqueous solution prepared by for example adding about 0.01 to 3.0 normality of a mineral acid such as a sulfuric acid, a nitric acid, and a hydrochloric acid or a carboxylic acid such as an acetic acid to an aqueous solution with one or both of an inorganic indium compound and an inorganic tin compound dissolved, and adjusting the same to about 3 to 4 pH can be used.

As the indium compound or the tin compound used for the preparation of the acidic aqueous solution with the indium compound or the tin compound dissolved, those already described as the water soluble inorganic indium compound and inorganic tin compound can be used preferably.

According to the dispersion prepared by dispersing the alkaline partially hydrolyzed product of the inorganic indium compound and the inorganic tin compound in the acidic aqueous solution with the indium compound or the tin compound dissolved, the total number of atoms of the indium and the tin in the acidic aqueous solution with the indium compound and the tin compound dissolved is preferably in a range of 30 to 180% with respect to the total number of atoms of the indium and the tin in the alkaline partially hydrolyzed product of the inorganic indium compound and the inorganic tin compound.

Furthermore, the film forming auxiliary agent made of an organic solvent solution containing the inorganic indium compound and the organic tin compound can be produced using as the inorganic indium compound, for example, $InCl_3$, or $In(NO_3)_3$, as the organic tin compound, a carboxylic acid salt, a dicarboxylic acid salt, or the like, and as the organic solvent, those capable of coordinating with both of the indium and the tin and dissolving the organic compound and the inorganic compound in the coating solution, such as aromatic hydrocarbons such as a toluene and a xylene, alcohols such as an ethanol and an isopropanol, acetates such as an ethyl acetate and a butyl acetate, ketones such as an acetylacetone, an acetone and a diethyl ketone, ethers such as a methoxy ethanol and an ethoxy ethanol, a tetrahydro furan, or the like.

(2) As the processing liquid containing metal ions or a metal compound, for example, an aqueous solution containing a metal salt or the like can be used. As the means for coating the processing liquid on the wettability changeable substrate 1 with the wettability pattern formed, the same methods used for the above-mentioned (1) transparent conductive film forming coating solution can be used. After the adhesion to the wettability pattern, it is solidified as needed by washing with water, drying, or the like.

As the metal element used as the metal ions, a copper, a silver, a palladium, a nickel, a cobalt, a tin, a titanium, a lead, a platinum, a gold, a chromium, a molybdenum, an iron, an iridium, a tungsten, a rhodium, or the like can be presented. These metal elements can be contained in a solution as a metal salt such as a sulfuric acid salt, an acetic acid salt, a nitric acid salt, a chloride, or a carboxylic acid salt. In particular, a copper sulfate is preferable.

It is preferable to provide the metal salt so as to have the metal ion concentration in the solution by 0.001 to 10M, preferably 0.01 to 1M. As the solvent for dissolving the metal salt, water or an organic solvent, such as a methanol and an isopropanol can be used.

When using the (2) processing liquid containing metal ions or a metal compound, the conductive pattern can be formed according to the wettability pattern only by the contact with the processing liquid. However, in order to further improve the conductivity of the formed conductive pattern, electroless plating may be applied. As an electroless plating solution, for example, those containing metal ions of a copper, a silver, a palladium, a nickel, a cobalt, a platinum, a gold, a rhodium, or the like can be presented.

(3) The thin film of a conductive metal or a conductive metal oxide formed by the gas phase growth method can be used for the wettability changeable layer 3 of the wettability changeable substrate 1. In this case, although the thin film is formed on the entire surface regardless of the existence or absence of the wettability pattern of the wettability changeable layer 3, the thin film can remain thereon according to the wettability pattern by peeling off the part with weak adhesion by an appropriate means, utilizing the fact that the adhesion of the thin film is weak in a part with low wettability and the adhesion is strong in a part with high wettability.

As the metal for providing the above-mentioned thin film, an aluminum, a tin, a zinc, a copper, a silver, a gold, a nickel, a chromium, or the like can be presented. Moreover, as the metal oxide for providing the above-mentioned thin film, $ZnO$, $CeO_2$, $Sb_2O_5$, $SnO_2$, an indium tin oxide (ITO), $In_2O_3$, $Al_2O_3$, an antimony dope tin oxide (ATO), an aluminum dope zinc oxide (AZO), or the like can be presented.

The thin film of the metal or the metal oxide can be formed by deposition, sputtering, ion plating, or a chemical gas phase growth method (CVD). It is preferable to form the same by 50 nm to 500 nm, or more thickness.

The part with weak adhesion can be peeled off also by polish or friction, however, a method by attaching a bonding sheet with an appropriate bonding force on the formed thin film, and peeling off the thin film with weak adhesion with respect to the wettability changeable layer 3 in the part with low wettability at the time of peeling off the attached bonding sheet is suitable.

(4) Also by using the thermally fusible conductive layer transfer substrate having a thermally fusible conductive layer as the transfer layer (such as a transfer sheet), the conductive pattern can be formed in the wettability changeable layer 3 of the wettability changeable substrate 1.

The thermally fusible conductive layer of the transfer layer is one prepared by dispersing a conductive substance such as powders of a metal including a copper, a silver, a gold, a palladium, an aluminum, a nickel, a cobalt, a platinum, a gold, a rhodium, a tin, a zinc and a chromium or a carbon black, or the like, in a thermally fusible or thermally softening binder such as a natural wax, a paraffin wax, a higher fatty acid, and a higher fatty acid amide, or the like. It can be laminated on an appropriate base material by hot melt coating, or the like so as to provide the thermally fusible conductive layer transfer substrate.

The thermally fusible conductive layer transfer substrate is superimposed onto the wettability changeable layer 3 of the wettability changeable substrate 1 so as to be contacted on the thermally fusible conductive layer side. Before or after the superimposition, or simultaneously with the superimposition, the thermally fusible conductive layer is heated for melting or softening. In this state, the thermally fusible conductive layer is melted or softened on the entirety.

When the melted or softened conductive layer is contacted with the wettability changeable layer 3 with the wettability pattern formed as mentioned above, since the molten or softened conductive layer has the adhesion of the conductive layer weak in a part with low wettability and the adhesion of the conductive layer strong in a part with high wettability, when the substrate of the thermally fusible conductive layer transfer substrate is peeled off, it is peeled off between the conductive layer and the wettability changeable layer with the conductive layer remaining only in a part with high wettability of the wettability changeable layer and the conductive layer laminated on the substrate in a part with low wettability, as a result, the conductive layer can be formed according to the wettability pattern.

EXAMPLES

Example 1

A photo mask with a light shielding pattern made of a chromium having 50 μm line width and space width and 0.2 μm thickness formed on a quartz glass was prepared. After coating a primer layer forming paint composition prepared by mixing the below-mentioned components and agitating at 25° C. for 24 hours onto the light shielding pattern, it was heated at 120° C. for 20 minutes so as to form a 0.1 μm thickness primer layer.

| (Primer layer forming paint composition) | |
| --- | --- |
| 0.1 normality hydrochloric acid aqueous solution | 50 g |
| Tetramethoxy silane | 100 g |

Then, after coating a photo catalyst inorganic coating agent containing a titanium dioxide (product name; "ST-K03" manufactured by Ishihara Sangyo Kaisha, Ltd.) onto the above-mentioned primer layer, it was heated at 150° C. for 20 minutes so as to form a 0.15 μm thickness photo catalyst layer and obtain a photo mask with the photo catalyst layer.

Then, a fluorine containing silicone based paint composition prepared by agitating at 25° C. for 24 hours after mixing the below-mentioned components was coated onto a glass substrate. It was heated at 120° C. for 15 minutes so as to form a 0.05 μm thickness wettability changeable layer and obtain a wettability changeable substrate.

| (Fluorine containing silicone based paint composition) | |
| --- | --- |
| 0.2 normality hydrochloric acid aqueous solution | 25 g |
| Fluoro alkyl silane | 15 g |
| Tetramethoxy silane | 50 g |

With the photo mask with the photo catalyst layer closely contacted onto the wettability changeable layer of the wettability changeable substrate obtained as mentioned above such that the photo catalyst layer side is contacted, by irradiating an ultraviolet ray having a 365 nm wavelength from the photo mask side by a 20 mW/cm$^2$ illuminance, a wettability pattern was formed on the wettability changeable layer surface. The contact angle of the wetting reference reagent (40 mN/m) in the unexposed part in the wettability pattern was 75°, and furthermore, it took 150 seconds to have the contact angle of the wetting reference reagent (40 mN/m) in the exposed part at 9° or less.

Then, by coating a transparent conductive film forming coating solution prepared as mentioned below to the surface of the wettability changeable layer with the wettability pattern formed by a blade coater, a transparent conductive coating solution was adhered only onto the exposed part.

Transparent conductive film forming coating solution

By gradually dropping an ammonium water to a solution obtained by dissolving 25 g of a hydrate of an indium sulfate ($In_2(SO_4)_3 \cdot 9H_2O$) and 1.4 g of a stannous sulfate ($Sn(SO_4)$) (composition ratio: Sn×100/(In+Sn)=7.5 atomic %) in 300 g of water until the solution pH became 8.5 so as to co-precipitate the indium and the tin in the solution as hydroxide fine particles. Then, the total amount of the solid component obtained by washing the co-precipitation product after centrifugal separation, without provided with a drying process was mixed with 300 g of a 0.03 normality hydrochloric acid aqueous solution with 10 g of an indium chloride ($InCl_3$) added, and dispersed by the application of a ultrasonication so as to obtain a transparent dispersion (A). On the other hand, 13.42 g of a solution obtained by dissolving 1 g of a tin acetyl acetonate hydrochloride in 15 g of an acetyl acetone was mixed with a solution obtained by dissolving 10 g of a hydrate of an indium nitrate ($In(NO_3)_3 \cdot 3H_2$)) in 8 g of an acetyl acetone, and furthermore, it was adjusted with an acetone so as to have a 20% solid component concentration in the total liquid amount. Then, the solution was refluxed at 140° C. for 4 hours, cooled down at a room temperature so as to obtain a film forming auxiliary agent (B). Thereafter, by mixing the transparent dispersion (A) and the film forming auxiliary agent (B), a transparent conductive film forming coating solution (C) was obtained.

Then, by baking the wettability changeable substrate at 600° C. for 1 hour after drying in the 55° C. air for 30 minutes, a transparent conductive pattern substrate with a transparent conductive pattern having 150 nm thickness and 50 μm line width and space width formed on the wettability changeable layer was obtained.

Example 2

In the same manner as in the example 1, a wettability pattern was formed on a wettability changeable substrate. The wettability changeable substrate with the wettability pattern formed was soaked in a copper sulfide aqueous solution adjusted to 0.5 M for 5 minutes, and it was washed with distilled water repeatedly for three times. pH of the used copper sulfate aqueous solution was 4.1. After washing, the wettability changeable substrate was soaked in a 0.01 M aqueous solution of a sodium borate hydride for 30 minutes, and then it was washed with distilled water so as to obtain a conductive pattern according to the wettability pattern. A conductive pattern comprising a copper having 50 μm line width and space width was formed in the obtained conductive pattern. By soaking the accordingly obtained conductive pattern further in an electroless copper plating liquid (product name; "Meruplate" CU-5100, manufactured by Meltex Inc.) for 30 minutes, a copper plating was applied to the conductive pattern so as to provide a wiring pattern.

Example 3

In the same manner as in the example 1, a wettability pattern was formed on a wettability changeable substrate. By superimposing the thermally fusible conductive layer of the thermally fusible conductive layer transfer substrate prepared as mentioned below to the surface of the wettability changeable substrate with the wettability pattern formed such that the wettability changeable substrate and the thermally fusible conductive layer are contacted, heating and at the same time peeling off the thermally fusible conductive layer transfer substrate, the thermally fusible conductive layer was adhered only in the exposed part.

Thermally fusible conductive layer transfer substrate

A mixture of 10% of a heated and dissolved paraffin wax and 90% of gold fine particles (both based on the capacity)

added thereto was coated onto a 100 μm thickness PET substrate by 5 μm thickness so as to provide a thermally fusible conductive layer transfer substrate.

Example 4

In the same manner as in the example 1, a wettability pattern was formed on a wettability changeable substrate. A 50 nm thickness gold thin film was formed on the surface of the wettability changeable substrate with the wettability pattern formed by the deposition method. Then, by adhering a bonding sheet onto the gold thin film and peeling off the same, the gold thin film in the unexposed part was adhered to the bonding sheet so as to be eliminated, and the gold thin film was adhered only in the exposed part.

What is claimed is:

1. A method for manufacturing a conductive pattern substrate comprising;
    preparing a wettability changeable substrate having a wettability changeable layer made of a material with the surface wettability changeable by the function of the photo catalyst on a first substrate and a photo catalyst substrate having a photo catalyst layer made of a photo catalyst or a resin composition containing a photo catalyst laminated on a second substrate,
    disposing the photo catalyst substrate and the wettability changeable substrate to have a distance of 200 μm or less in between and not in contact, then
    irradiating a light beam in a pattern-like form so as to form a wettability pattern having an area having high wettability corresponding to the light beam irradiated part and an area having low wettability corresponding to the light beam unirradiated part on the wettability changeable layer surface,
    contacting a transparent conductive film forming composition with the wettability changeable layer with the wettability pattern formed on the entire surface so as to selectively adhere the transparent conductive film forming composition to the area having high wettability, and
    solidifying the adhered transparent conductive film forming composition so as to form a conductive pattern.

2. A method for manufacturing a conductive pattern substrate comprising;
    preparing a wettability changeable substrate having a wettability changeable layer made of a material with the surface wettability changeable by the function of the photo catalyst on a first substrate and a photo catalyst substrate having a photo catalyst layer made of a photo catalyst or a resin composition containing a photo catalyst laminated on a second substrate,
    disposing the photo catalyst substrate and the wettability changeable substrate to have a distance of 200 μm or less in between and not in contact, then
    irradiating a light beam in a pattern-like form so as to form a wettability pattern having an area having high wettability corresponding to the light beam irradiated part and an area having low wettability corresponding to the light beam unirradiated part on the wettability changeable layer surface,
    contacting a processing liquid containing metal ions or a compound of the metal with the wettability changeable layer with the wettability pattern formed so as to selectively adhere the processing liquid to the area having high wettability, and
    solidifying the adhered processing liquid so as to form a conductive pattern.

3. A method for manufacturing a conductive pattern substrate comprising;
    preparing a wettability changeable substrate having a wettability changeable layer made of a material with the surface wettability changeable by the function of the photo catalyst on a first substrate and a photo catalyst substrate having a photo catalyst layer made of a photo catalyst or a resin composition containing a photo catalyst laminated on a second substrate,
    disposing the photo catalyst substrate and the wettability changeable substrate to have a distance of 200 μm or less in between and not in contact, then
    irradiating a light beam in a pattern-like form so as to form a wettability pattern having an area having high wettability corresponding to the light beam irradiated part and an area having low wettability corresponding to the light beam unirradiated part on the wettability changeable layer surface,
    forming a thin film made of a conductive metal or a conductive metal oxide on the entire surface by the gas phase growth method to the wettability changeable layer with the wettability pattern formed, and then
    eliminating the part corresponding to the area having low wettability among the formed thin film so as to form a conductive pattern.

4. The method for manufacturing a conductive pattern substrate according to claim 3, wherein the gas phase growth method is any one selected from the group consisting of a chemical gas phase growth method, and a physical gas phase method including deposition, sputtering and an ion plating method.

5. A method for manufacturing a conductive pattern substrate comprising;
    preparing a wettability changeable substrate having a wettability changeable layer made of a material with the surface wettability changeable by the function of the photo catalyst on a first substrate and a photo catalyst substrate having a photo catalyst layer made of a photo catalyst or a resin composition containing a photo catalyst laminated on a second substrate,
    disposing the photo catalyst substrate and the wettability changeable substrate to have a distance of 200 μm or less in between and not in contact, then
    irradiating a light beam in a pattern-like form so as to form a wettability pattern having an area having high wettability corresponding to the light beam irradiated part and an area having low wettability corresponding to the light beam unirradiated part on the wettability changeable layer surface,
    superimposing a thermally fusible conductive layer transfer substrate with a thermally fusible conductive layer made of a thermally fusible substance containing a conductive substance laminated on a third substrate onto the wettability changeable layer with the wettability pattern formed such that the thermally fusible conductive layer side is to be contacted, and
    melting or softening the thermally fusible conductive layer so as to form a conductive pattern by selectively adhering the thermally fusible conductive layer onto the area having high wettability.

* * * * *